(12) United States Patent
Samelis

(10) Patent No.: US 7,268,627 B2
(45) Date of Patent: Sep. 11, 2007

(54) PRE-MATCHING OF DISTRIBUTED AND PUSH-PULL POWER TRANSISTORS

(75) Inventor: Apostolos Samelis, Athens-Vrilissia (GR)

(73) Assignee: Theta Microelectronics, Inc., San Jose, CA (US)

( * ) Notice: Subject to any disclaimer, the term of this patent is extended or adjusted under 35 U.S.C. 154(b) by 122 days.

(21) Appl. No.: 11/265,991

(22) Filed: Nov. 3, 2005

(65) Prior Publication Data

US 2006/0108664 A1 May 25, 2006

Related U.S. Application Data

(60) Provisional application No. 60/624,199, filed on Nov. 3, 2004.

(51) Int. Cl.
*H03F 3/68* (2006.01)
(52) U.S. Cl. .................. 330/295; 330/286
(58) Field of Classification Search .......... 330/54, 330/124 R, 286, 295
See application file for complete search history.

(56) References Cited

U.S. PATENT DOCUMENTS

| | | | |
|---|---|---|---|
| 4,475,119 A | | 10/1984 | Kuo et al. |
| 4,803,443 A | * | 2/1989 | Takagi et al. ............... 330/277 |
| 5,920,230 A | * | 7/1999 | Beall ........................... 330/54 |
| 6,646,321 B2 | | 11/2003 | Roodnat |
| 6,861,906 B2 | * | 3/2005 | Mori et al. ................. 330/295 |
| 2004/0061214 A1 | | 4/2004 | Crescenzi, Jr. |

OTHER PUBLICATIONS

Becciolini, B., "Motorola Semiconductor Application Note AN721—Impedance Matching Networks Applied to RF Power Transistors", Sep. 23, 1993, pp. 1-15.
"Dallas Semiconductor/Maxim Application Note 742—Impedance Matching and the Smith Chart: The Fundamentals", Mar. 23, 2001, pp. 1-16.

* cited by examiner

*Primary Examiner*—Henry Choe
(74) *Attorney, Agent, or Firm*—Blakely Sokoloff Taylor & Zafman LLP

(57) ABSTRACT

Pre-matching of distributed push-pull and power transistors enabling the effective use of high-power and high-frequency transistor arrays. In accordance with the invention, a pre-matching element is connected between stages of multi-transistor arrays. The pre-matching element serves to transform the impedance at a connecting point between stages toward an impedance level that is less sensitive to transmission line losses. In one embodiment of the invention the pre-matching element is a shunt inductor.

33 Claims, 4 Drawing Sheets

|  | Without Pre-matching | | With Pre-matching | |
| --- | --- | --- | --- | --- |
|  | $Z_{in.opt}$ | MAG | $Z_{in.opt}$ | MAG |
| $Z_3$ | 0.322-j6.56 | 12.645 | 33.7+j3.2 | 8.36 |
| $Z_2$ | 1.027-j1.5 | 8.11 | 17.5+j3.37 | 8.23 |
| $Z_1$ | 1.56+j0.7 | 4.8 | 12.2+j3.5 | 8.058 |

PRE-MATCHING OF DISTRIBUTED AND PUSH-PULL POWER TRANSISTORS

CROSS-REFERENCE TO RELATED APPLICATION

This application claims the benefit of U.S. Provisional Patent Application No. 60/624,199 filed Nov. 3, 2004.

BACKGROUND OF THE INVENTION

1. Field of the Invention

The present invention relates to distributed and push-pull power transistors, and more specifically to the pre-matching of power transistors.

2. Prior Art

Distributed amplifiers for high-power, high-frequency applications utilize multi-transistor arrays that are represented by distributed large-signal models, such as the one shown in FIG. 1. Each array comprises a plurality of transistors, for example transistors $Q_1$ through $Q_N$, connected to allow for high-power operation, each multi-transistor array effectively forming a transistor 110 or 120 having an effective emitter (E) and an effective collector (C).

A simulation of such a circuit reveals significant degradation of the microwave characteristics of the transistor arrays when compared to an ideal power transistor. This degradation is caused by the losses of the transmission lines, for example transmission lines 112-1 through 112-N, connecting the bases of transistor $Q_1$ through $Q_N$, and transmission lines 130-1 through 130-M, connecting the transistor arrays, and is best explained by observing the optimum impedances at various locations in the circuit. These locations are shown as $Z_1$ through $Z_7$ in FIG. 1. For the ideal device, increasing the number of transistors results in a decrease of the optimum input matching impedance, which, in this case, also remains capacitive. However, in the case of an actual device, such as the one represented by the model of FIG. 1, the lossy line segments also contribute to this impedance. Therefore the input impedance of transistor $Q_1$ of effective transistor 110, for example, is large compared to the resistance of the line connecting it to transistor $Q_1$ of effective transistor 120. Therefore, the line segment at the base terminal of transistor $Q_1$ of effective transistor 110 will not influence its microwave gain or optimum impedance significantly. Notably, as more transistors are added to the transistor array, for example array 110, the total device impedance decreases. Eventually the total device impedance reaches values that are comparable to the impedance of the transmission lines. At this point, a significant effect is observed on the microwave gain of the transistor array.

This situation is illustrated in FIG. 2 representing the evolution of the transistor optimum input impedances under conjugate matching conditions, $Z_{in,opt}$ (=$Z_1$ through $Z_7$), as well as the maximum available gain (MAG) in various locations. Similarly there is a maximum stable gain (MSG) graph, not shown. It is shown that there is a continuous increase of influence of the lossy lines on the optimum input impedance and MAG as device complexity is increased. Specifically, MAG loss between positions 5 to 6 of the graph is 1.34 dB while it is 2.05 dB between positions 3 and 4. Moreover, while the addition of one array of transistors does not significantly affect MAG when the device array complexity is small (transitions 6-7 and 4-5), this is not the case for transition 2-3 where MAG is reduced by 0.8 dB. Also, the real part of $Z_{in,opt}$ is increasing as the size of the array increases, which is the opposite trend compared to the case of the ideal model. Finally, the imaginary part of $Z_{in,opt}$ gradually becomes inductive as more stages are added due to the increased influence of the parasitic inductances of the transmission lines. This is also contrary to the trend in the case of the ideal situation where no transmission line losses are considered. The above degradation of MAG of large transistor arrays prohibits their exploitation in power applications, especially at high frequencies, for example at frequencies higher than 5.0 GHz.

In view of the deficiencies of solutions suggested by prior art, it would be advantageous to provide a solution that eliminates or at least significantly reduces these negative effects. It would be further advantageous if such a solution would be suitable for high-power, high-frequency circuits, and in particular, those circuits operating at frequencies higher than 5.0 GHz.

DETAILED DESCRIPTION OF THE PREFERRED EMBODIMENTS

Figure 1:
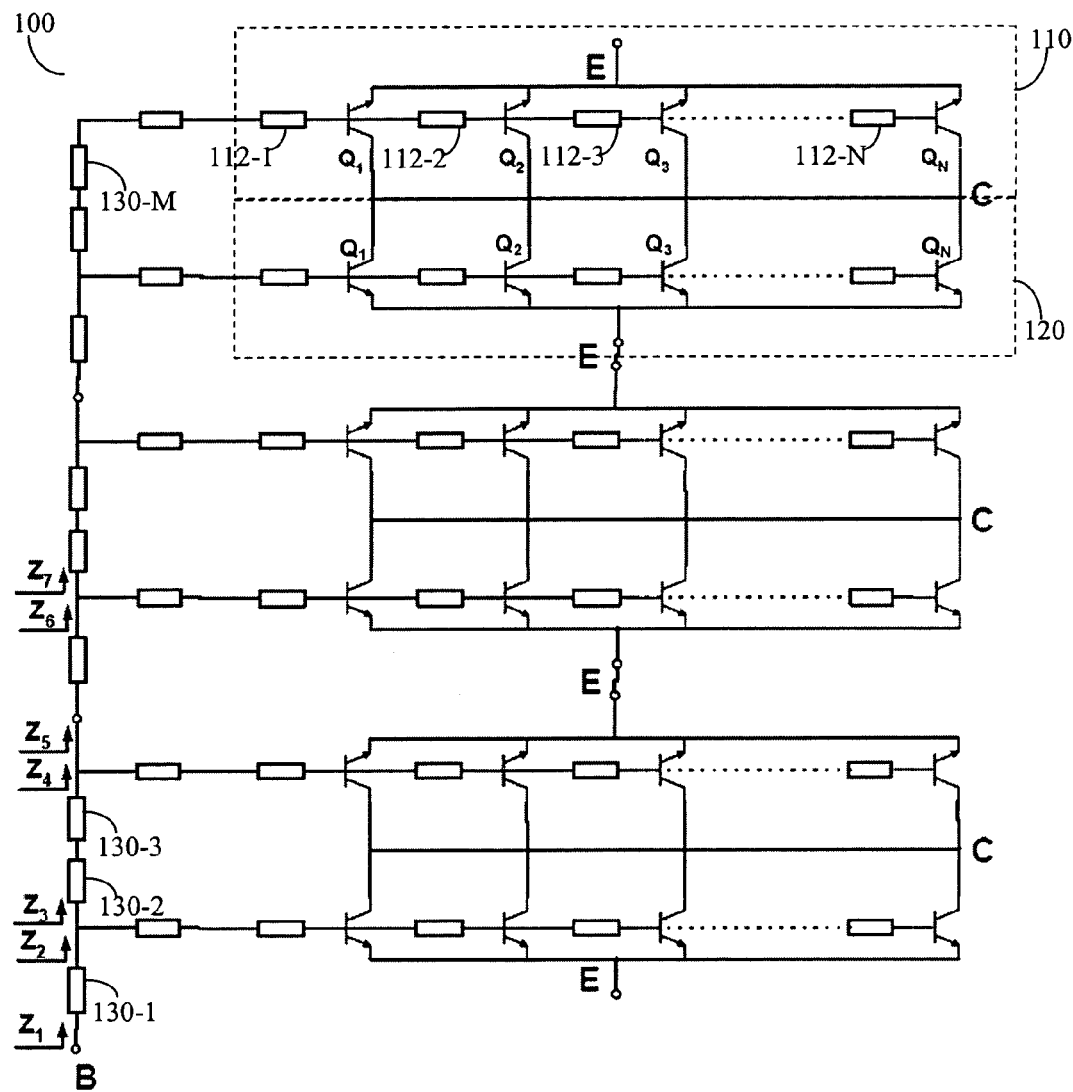
FIG. 1 is a distributed equivalent circuit model of a power transistor used in high-power high-frequency applications (PRIOR ART).
Figure 2:
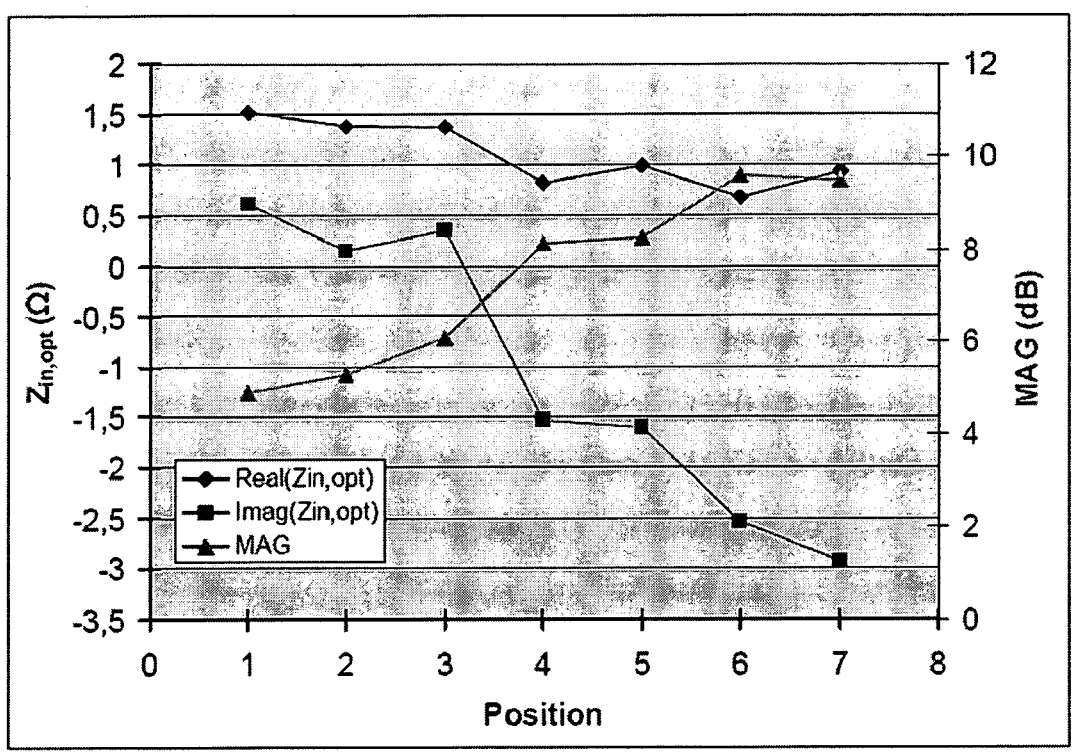
FIG. 2 is a graph depicting optimum input impedance ensuring maximum gain of the power transistor with no pre-matching at various locations.

The present invention comprises the addition of pre-matching circuitry aimed at achieving matching between stages of the transistor arrays for systems utilizing transistor arrays that are to operate in high-power and high-frequency, such as radio frequencies (RF), to avoid the deficiencies observed in prior art solutions. In that regard, a stage comprises two adjacent arrays, such as arrays 310 and 320 of FIG. 3, the arrays having common collector regions, common base regions, and common emitter regions. In FIG. 1, in an exemplary prior art distributed transistor, three stages are illustrated, while in FIG. 3, three of the stages are specifically illustrated for example, though M stages are indicated, where M could be as low as 1, though normally will be 2 or more.

Figure 3:
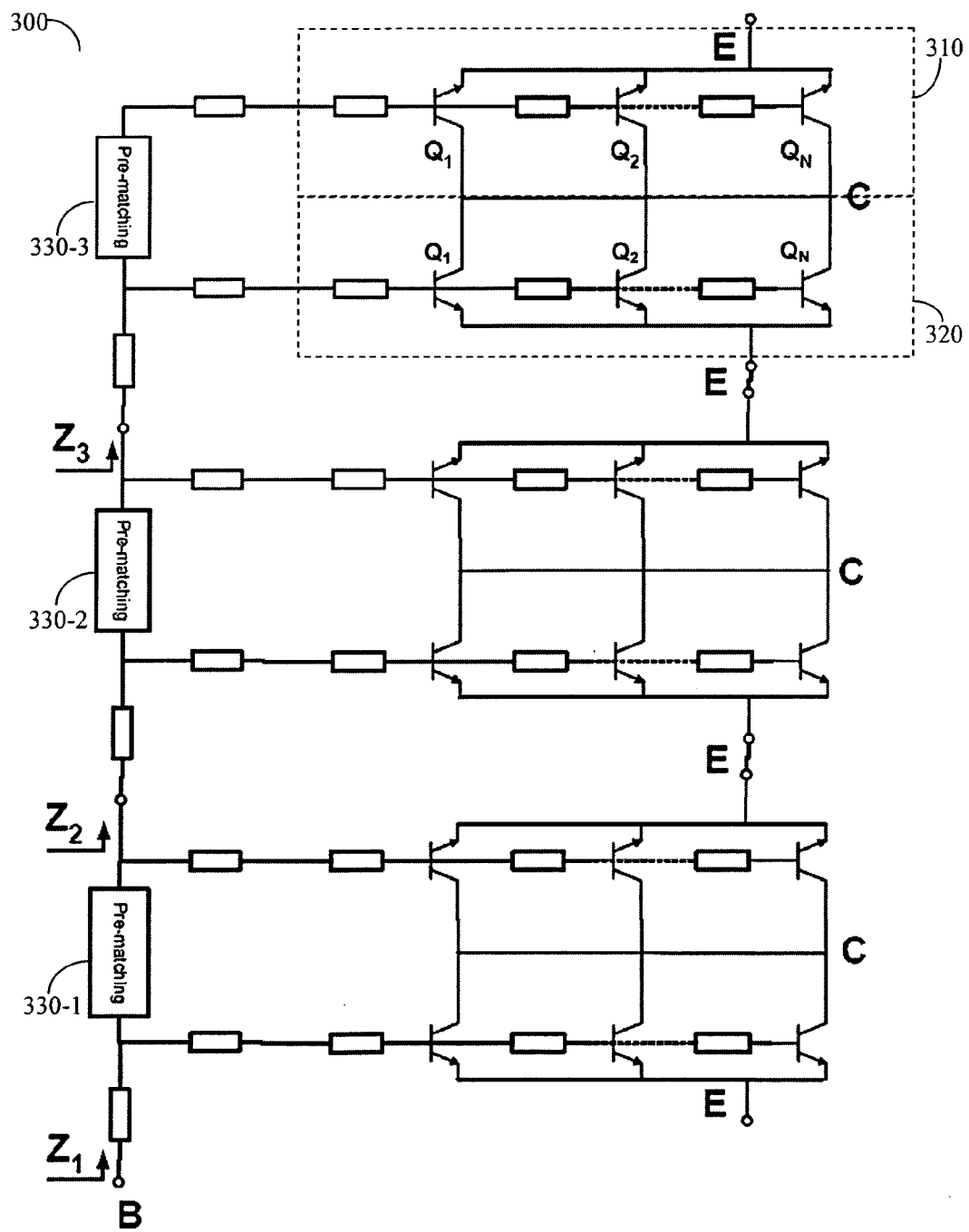
FIG. 3 is an exemplary circuit model of a power transistor with pre-matching for use in high-power high-frequency applications.

Reference is now made to FIG. 3 where an exemplary and non-limiting circuit model 300 of a device 300 that is a power transistor with pre-matching for use in high-power, high-frequency applications is shown. As can be seen, in each stage, for example between arrays 310 and 320, there is a pre-matching element, for example pre-matching element 330-3. The role of the pre-matching element is to transform the impedance at the connecting point toward an impedance level that is less sensitive to transmission line losses. By doing so, the effect of subsequent transmission lines on the input impedance and thus the maximum available gain (MAG) or the maximum stable gain (MSG) of the device is diminished. Therefore high-power can be easily achieved without sacrificing the high-frequency operation, as well as minimization of losses.

In one embodiment of the disclosed invention, the pre-matching element 310 is an inductor connected to ground, i.e., a shunt inductor. The shunt inductor transforms an impedance of the transistor array counterclockwise along a constant conductance circle on the Smith-Chart. In doing so, the transformed impedance of the transistor array and therefore its sensitivity to subsequent transmission lines is decreased. This results in a smaller gain degradation of a pre-matched array when compared to an unmatched array. The determination of the inductance value is empirical and is determined such that the transformed impedance has a higher real part compared to the impedance prior to the transformation, and negligible imaginary part. In an application with a power range of 30 dBm at a frequency of 5.5 GHz, an appropriate inductor would have a value of approximately 0.2 nH.

Figures 4, 5:
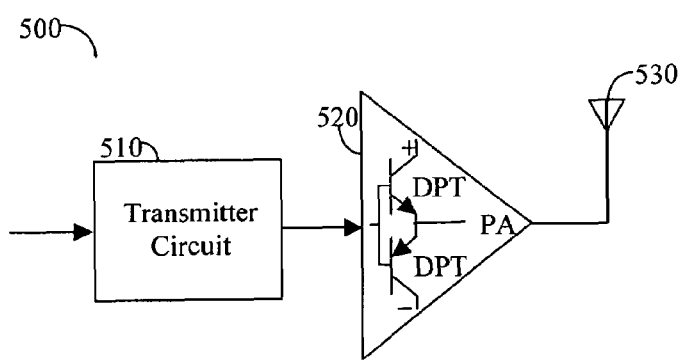
FIG. 4 is a table comparing the performance of a standard array of transistors and an array of transistors with pre-matching.
FIG. 5 is a schematic diagram of a wireless transmitter incorporating the present invention.

Reference is now made to FIG. 4 where an exemplary and non-limiting table comparing the performance of a standard array of transistors and an array of transistors with pre-matching is shown. In the table $Z_{in,opt}$ and MAG are compared at several positions in the transistor array. It is clearly shown that when the circuit implemented in accordance with the disclosed invention, a significant portion, greater than 3 dB, of the MAG is recovered when pre-matching is used. Moreover, the input conjugate match impedance, $Z_1$, is somewhat inductive and significantly larger compared to the case where pre-matching is omitted. The effects are similar for MSG.

While the disclosed invention is shown for NPN bipolar transistors, other transistors in a variety of manufacturing technologies may make use of this invention without departing from the scope of the invention. These technologies include, but are not limited to, PNP bipolar, metal-oxide semiconductor (MOS), complementary MOS (CMOS) and bipolar-CMOS (bi-CMOS). In that regard, while the transistor symbol used in the FIGS. is that of an NPN bipolar transistor, that symbol is to be understood to be that of a transistor in general, independent of its construction or conductivity type. The disclosed implementation of the transistor array may be further implemented as part of an integrated circuit (IC), and more specifically in conjunction with the use of RF circuits in general and wireless circuits in particular. In the bipolar case, by way of example, an exemplary circuit for a distributed PNP transistor in accordance with the present invention may be obtained by changing the NPN transistors shown in FIG. 3 to PNP transistors by simply reversing the direction of the arrow in the transistor symbol. The resulting distributed push-pull NPN and PNP power transistor pairs may then be used in high-power and high-frequency push-pull amplifiers of otherwise conventional design. One such application is in wireless transmitters, and particularly battery operated wireless transmitters, such as circuit 500 shown in FIG. 5. As shown therein, such a wireless transmitter would have a push-pull output formed by two complementary distributed power transistors (DPT) that comprise power amplifier (PA) 520 driven by a transmitter circuit 510 and driving the antenna 530. Of course this is exemplary only, as the present invention may be used in other applications also. Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A distributed power transistor for high-power and high-frequency operation, the distributed power transistor comprising:
   at least a first stage, wherein the first stage comprises:
      a first plurality of transistors, each having an emitter, a base and a collector, each of the first plurality of transistors having their bases coupled together; and,
      a second plurality of transistors, each having an emitter, a base and a collector, each of the second plurality of transistors having their bases coupled together;
   the emitters of the first and second pluralities of transistors being coupled together and the collectors of the first and second pluralities of transistors being coupled together;
   the bases of the first plurality of transistors being coupled to the bases of the second plurality of transistors through a first pre-matching element.

2. The distributed power transistor of claim 1, wherein the first pre-matching element comprises a shunt inductor.

3. The distributed power transistor of claim 2, wherein the shunt inductor transforms an impedance of the second plurality of transistors counterclockwise along a constant conductance circle on the Smith-Chart.

4. The distributed power transistor of claim 2, wherein for achieving a 30 dBm power range at a frequency of 5.5 GHz, a shunt inductor having a value of 0.2 nH is used.

5. The distributed power transistor of claim 1, wherein the maximum available gain (MAG) at various points of the distributed power transistor is essentially unaffected by the addition of at least a second stage.

6. The distributed power transistor of claim 1, wherein the maximum stable gain (MSG) at various points of the distributed power transistor is essentially unaffected by the addition of at least a second stage.

7. The distributed power transistor of claim 1 comprising at least part of an integrated circuit.

8. The distributed power transistor of claim 1, the distributed power transistor being in a wireless transmitter.

9. The distributed power transistor of claim 1, the distributed power transistor being in a power amplifier.

10. A push-pull circuit comprised of a first distributed power transistor in accordance with claim 1 wherein the first and second plurality of transistors are of a first type, and a second distributed power transistor in accordance with claim 1 wherein the first and second plurality of transistors are of a second type.

11. The push-pull circuit of claim 10 wherein the first type is an NPN type and the second type is a PNP type.

12. The distributed power transistor of claim 1 further comprising at least a second stage, the second stage comprising:
   at least a second stage, wherein the second stage comprises:
      a third plurality of transistors, each having an emitter, a base and a collector, the third plurality of transistors having their bases coupled together; and,
      a fourth plurality of transistors, each having an emitter, a base and a collector, the fourth plurality of transistors having their bases coupled together;
   the emitters of the first, second, third and fourth pluralities of transistors being coupled together and the collectors of the first, second, third and fourth pluralities of transistors being coupled together;
   the bases of the first plurality of transistors being coupled to the bases of the second plurality of transistors through a second first pre-matching element, the bases of the third plurality of transistors being coupled to the bases of the fourth plurality of transistors through a second pre-matching element;

the bases of the second plurality of transistors being coupled to the bases of the third plurality of transistors.

13. The distributed power transistor of claim 12 wherein the first and second pre-matching elements comprise shunt inductors.

14. A distributed power transistor for high-power and high-frequency operation, the distributed power transistor comprising:
  at least a first stage, wherein the first stage comprises:
    a first plurality of transistors, each having first and second terminals and a control terminal, conduction between the first and second terminals being controlled by the voltage between the control terminal and the first terminal, each of the first plurality of transistors having their control terminals coupled together; and,
    a second plurality of transistors, each having first and second terminals and a control terminal, conduction between the first and second terminals being controlled by the voltage between the control terminal and the first terminal, each of the second plurality of transistors having their control terminals coupled together;
  the first terminals of the first and second pluralities of transistors being coupled together and the second terminals of the first and second pluralities of transistors being coupled together;
  the control terminals of the first plurality of transistors being coupled to the control terminals of the second plurality of transistors through a first pre-matching element.

15. The distributed power transistor of claim 14, wherein the pre-matching element comprises a shunt inductor.

16. The distributed power transistor of claim 15, wherein the shunt inductor transforms an impedance of the second plurality of transistors counterclockwise along a constant conductance circle on the Smith-Chart.

17. The distributed power transistor of claim 15, wherein for achieving a 30 dBm power range at a frequency of 5.5 GHz, a shunt inductor having a value of 0.2 nH is used.

18. The distributed power transistor of claim 14, wherein the maximum available gain (MAG) at various points of the distributed power transistor is essentially unaffected by the addition of at least a second stage.

19. The distributed power transistor of claim 14, wherein the maximum stable gain (MSG) at various points of the distributed power transistor is essentially unaffected by the addition of at least a second stage.

20. The distributed power transistor of claim 14, wherein the transistor technology is one of: bipolar, metal-oxide-semiconductor (MOS), complementary MOS (CMOS) and bipolar-CMOS (bi-CMOS).

21. The distributed power transistor of claim 14 comprising at least part of an integrated circuit.

22. The distributed power transistor of claim 14, the distributed power transistor being in a wireless transmitter.

23. The distributed power transistor of claim 14, the distributed power transistor being in a power amplifier.

24. The distributed power transistor of claim 14 further comprising at least a second stage, the second stage comprising:
  at least a second stage, wherein the second stage comprises:
    a third plurality of transistors, each having first and second terminals and a control terminal, conduction between the first and second terminals being controlled by the voltage between the control terminal and the first terminal, each of the third plurality of transistors having their control terminals coupled together; and,
    a fourth plurality of transistors, each having first and second terminals and a control terminal, conduction between the first and second terminals being controlled by the voltage between the control terminal and the first terminal, each of the fourth plurality of transistors having their control terminals coupled together;
  the first terminals of the first and second pluralities of transistors being coupled together and the second terminals of the first and second pluralities of transistors being coupled together;
  the control terminals of the first plurality of transistors being coupled to the control terminals of the second plurality of transistors through a first pre-matching element, the control terminals of the third plurality of transistors being coupled to the control terminals of the fourth plurality of transistors through a second pre-matching element;
  the bases of the second plurality of transistors being coupled to the bases of the third plurality of transistors.

25. The distributed power transistor of claim 24, wherein the first and second pre-matching elements comprise shunt inductors.

26. A power amplifier formed by complimentary distributed transistors, each distributed transistor having at least a first stage, wherein the first stage comprises:
  a first plurality of transistors, each having first and second terminals and a control terminal, conduction between the first and second terminals being controlled by the voltage between the control terminal and the first terminal, each of the first plurality of transistors having their control terminals coupled together; and,
  a second plurality of transistors, each having first and second terminals and a control terminal, conduction between the first and second terminals being controlled by the voltage between the control terminal and the first terminal, each of the second plurality of transistors having their control terminals coupled together;
  the first terminals of the first and second pluralities of transistors being coupled together and the second terminals of the first and second pluralities of transistors being coupled together;
  the control terminals of the first plurality of transistors being coupled to the control terminals of the second plurality of transistors through a first pre-matching element.

27. The power amplifier of claim 26, wherein the first pre-matching element comprises a shunt inductor.

28. The power amplifier of claim 27 wherein each distributed transistor further comprises at least a second stage, the second stage comprising:
  a third plurality of transistors, each having first and second terminals and a control terminal, conduction between the first and second terminals being controlled by the voltage between the control terminal and the first terminal, each of the third plurality of transistors having their control terminals coupled together; and,
  a fourth plurality of transistors, each having first and second terminals and a control terminal, conduction between the first and second terminals being controlled by the voltage between the control terminal and the first terminal, each of the fourth plurality of transistors having their control terminals coupled together;

the first terminals of the first and second pluralities of transistors being coupled together and the second terminals of the first and second pluralities of transistors being coupled together;

the control terminals of the third plurality of transistors being coupled to the control terminals of the fourth plurality of transistors through a second pre-matching element;

the bases of the second plurality of transistors being coupled to the bases of the third plurality of transistors.

29. The distributed power transistor of claim 28, wherein the second pre-matching element comprises a second shunt inductor.

30. In a wireless transmitter, the improvement comprising:

a power amplifier a push-pull output formed by complimentary distributed transistors, each distributed transistor having at least a first stage, wherein the first stage comprises:

a first plurality of transistors, each having first and second terminals and a control terminal, conduction between the first and second terminals being controlled by the voltage between the control terminal and the first terminal, each of the first plurality of transistors having their control terminals coupled together; and, a second plurality of transistors, each having first and second terminals and a control terminal, conduction between the first and second terminals being controlled by the voltage between the control terminal and the first terminal, each of the second plurality of transistors having their control terminals coupled together;

the first terminals of the first and second pluralities of transistors being coupled together and the second terminals of the first and second pluralities of transistors being coupled together;

the control terminals of the first plurality of transistors being coupled to the control terminals of the second plurality of transistors through a first pre-matching element.

31. The improvement of claim 30, wherein the first pre-matching element comprises a shunt inductor.

32. The improvement of claim 31 wherein each distributed transistor further comprises at least a second stage, the second stage comprising:

a third plurality of transistors, each having first and second terminals and a control terminal, conduction between the first and second terminals being controlled by the voltage between the control terminal and the first terminal, each of the third plurality of transistors having their control terminals coupled together; and, a fourth plurality of transistors, each having first and second terminals and a control terminal, conduction between the first and second terminals being controlled by the voltage between the control terminal and the first terminal, each of the fourth plurality of transistors having their control terminals coupled together;

the first terminals of the first and second pluralities of transistors being coupled together and the second terminals of the first and second pluralities of transistors being coupled together;

the control terminals of the third plurality of transistors being coupled to the control terminals of the fourth plurality of transistors through a second pre-matching element;

the bases of the second plurality of transistors being coupled to the bases of the third plurality of transistors.

33. The distributed power transistor of claim 32, wherein the second pre-matching element comprises a second shunt inductor.

* * * * *